US009805656B2

(12) United States Patent
Hu et al.

(10) Patent No.: US 9,805,656 B2
(45) Date of Patent: Oct. 31, 2017

(54) ORGANIC LIGHT EMITTING DISPLAY DEVICE, PIXEL CIRCUIT OF THE SAME AND DRIVING METHOD THEREOF

(71) Applicants: Shanghai Tianma AM-OLED Co., Ltd., Shanghai (CN); Tianma Micro-Electronics Co., Ltd., Shenzhen (CN)

(72) Inventors: Xiaoxu Hu, Shanghai (CN); Li Zhang, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 495 days.

(21) Appl. No.: 14/480,524

(22) Filed: Sep. 8, 2014

(65) Prior Publication Data

US 2015/0310806 A1    Oct. 29, 2015

(30) Foreign Application Priority Data

Apr. 23, 2014    (CN) .......................... 2014 1 0166379

(51) Int. Cl.
G09G 3/32       (2016.01)
G09G 3/3266     (2016.01)
(Continued)

(52) U.S. Cl.
CPC ......... *G09G 3/3266* (2013.01); *G09G 3/3233* (2013.01); *G09G 3/3258* (2013.01);
(Continued)

(58) Field of Classification Search
CPC .......................................... G09G 3/3208–3/34
See application file for complete search history.

(56) References Cited

U.S. PATENT DOCUMENTS

| 2009/0309863 A1* | 12/2009 | Seto | G09G 3/3233 345/212 |
|---|---|---|---|
| 2010/0201656 A1 | 8/2010 | Han et al. | |
| 2014/0339998 A1* | 11/2014 | Hsu | G09G 3/3233 315/291 |

FOREIGN PATENT DOCUMENTS

| CN | 100541574 C | 9/2009 |
|---|---|---|
| CN | 202855271 U | 4/2013 |

(Continued)

OTHER PUBLICATIONS

German Application No. 102014219631.0, First Office Action dated Feb. 23, 2017.

*Primary Examiner* — William Boddie
*Assistant Examiner* — Jeffrey A Parker
(74) *Attorney, Agent, or Firm* — Alston & Bird LLP

(57) ABSTRACT

An organic light emitting display device, a pixel circuit of the organic light emitting display device and a method of driving the same are disclosed. The pixel circuit comprises a driving transistor, a first transistor, a second transistor, a third transistor, a fourth transistor, a first capacitor, a second capacitor, a light emitting diode and a compensating diode. The degradation of the light emitting diode is compensated by the compensating diode. Since the degradation phenomena of the light emitting diode is compensated by the compensating diode, the light emitting diode is able to maintain an effective and normal brightness while using the same driving voltage, thereby ensuring higher display quality of images and scenes of the organic light emitting display device.

12 Claims, 7 Drawing Sheets

(51) Int. Cl.
 G09G 3/3258 (2016.01)
 H01L 27/32 (2006.01)
 G09G 3/3233 (2016.01)
 G09G 3/3291 (2016.01)

(52) U.S. Cl.
 CPC ....... *H01L 27/3276* (2013.01); *G09G 3/3291* (2013.01); *G09G 2300/088* (2013.01); *G09G 2300/0819* (2013.01); *G09G 2300/0852* (2013.01); *G09G 2300/0861* (2013.01); *G09G 2310/0251* (2013.01); *G09G 2320/0204* (2013.01); *G09G 2320/043* (2013.01); *G09G 2320/045* (2013.01)

(56) References Cited

FOREIGN PATENT DOCUMENTS

| | | |
|---|---|---|
| CN | 103295528 A | 9/2013 |
| TW | I268466 | 12/2006 |

* cited by examiner

ORGANIC LIGHT EMITTING DISPLAY DEVICE, PIXEL CIRCUIT OF THE SAME AND DRIVING METHOD THEREOF

CROSS-REFERENCES TO RELATED APPLICATIONS

This application claims the benefit of priority to Chinese Patent Application No. 201410166379.3, filed with the Chinese Patent Office on Apr. 23, 2014 and entitled "Organic Light Emitting Display Device, Pixel Circuit of the Same and Driving Method Thereof", the content of which is incorporated herein by reference in its entirety.

BACKGROUND OF THE INVENTION

With the continuous development of multimedia technologies, Organic Light Emitting Diodes (OLEDs) used in the organic light emitting display technologies have been increasingly applied to high-performance organic light emitting display devices. As for the organic light emitting display device using the OLEDs, the illumination brightness of the OLED is controlled by the amount of current flowing through the OLED, thereby the effect of showing different grey scales is obtained through different illumination brightness of the OLEDs in the organic light emitting display device.

In the prior art, with the continuity of using the organic light emitting display device, the organic light emitting diodes in pixel circuits may degrade to different degrees after the organic light emitting display device has illuminated over a long time, thereby causing an increase in the threshold voltage of the OLED. Due to such increase of the threshold voltage of the OLED, the current flowing through the OLED is reduced under the effect of the same driving voltage, thus the illumination brightness of the OLED is decreased, so that the display quality of the organic light emitting display device is decreased and the service life of the organic light emitting display device is further shortened.

BRIEF SUMMARY OF THE INVENTION

One inventive aspect is a pixel circuit of an organic light emitting display device. The pixel circuit includes a driving transistor, where a gate electrode of the driving transistor is connected with a first node. The pixel circuit also includes a first transistor, where a drain electrode of the first transistor is connected with a source electrode of the driving transistor, a source electrode of the first transistor is configured to receive a first power supply signal, and a gate electrode of the first transistor is configured to receive a first scanning signal for turning on and off the first transistor. The pixel circuit also includes a second transistor, where a drain electrode of the second transistor is connected with the source electrode of the driving transistor, a source electrode of the second transistor is connected with the first node, and a gate electrode of the second transistor is configured to receive a second scanning signal for turning on and off the second transistor. The pixel circuit also includes a first capacitor, where a first terminal of the first capacitor is connected with the first node, and a second terminal of the first capacitor is connected with a second node. The pixel circuit also includes a second capacitor, where a first terminal of the second capacitor is connected with the first node, and a second terminal of the second capacitor is connected with a third node. The pixel circuit also includes a third transistor, where a drain electrode of the third transistor is connected with the third node, a source electrode of the third transistor is configured to receive a data signal, and a gate electrode of the third transistor is configured to receive a third scanning signal for turning on and off the third transistor. The pixel circuit also includes a fourth transistor, where a source electrode of the fourth transistor is connected with the second node, and a gate electrode of the fourth transistor is configured to receive a fourth scanning signal for turning on and off the fourth transistor. The pixel circuit also includes a light emitting diode, where an anode of the light emitting diode is connected with the second node and a cathode of the light emitting diode is configured to receive a second power supply signal. The pixel circuit also includes a compensating diode, where an anode of the compensating diode is connected with a drain electrode of the fourth transistor, and a cathode of the compensating diode is configured to receive the second power supply signal.

Another inventive aspect is a method of driving a pixel circuit of an organic light emitting display device. The pixel circuit includes a driving transistor, where a gate electrode of the driving transistor is connected with a first node. The pixel circuit also includes a first transistor, where a drain electrode of the first transistor is connected with a source electrode of the driving transistor, a source electrode of the first transistor is configured to receive a first power supply signal, and a gate electrode of the first transistor is configured to receive a first scanning signal for turning on and off the first transistor. The pixel circuit also includes a second transistor, where a drain electrode of the second transistor is connected with the source electrode of the driving transistor, a source electrode of the second transistor is connected with the first node, and a gate electrode of the second transistor is configured to receive a second scanning signal for turning on and off the second transistor. The pixel circuit also includes a first capacitor, where a first terminal of the first capacitor is connected with the first node, and a second terminal of the first capacitor is connected with a second node. The pixel circuit also includes a second capacitor, where a first terminal of the second capacitor is connected with the first node, and a second terminal of the second capacitor is connected with a third node. The pixel circuit also includes a third transistor, where a drain electrode of the third transistor is connected with the third node, a source electrode of the third transistor is configured to receive a data signal, and a gate electrode of the third transistor is configured to receive a third scanning signal for turning on and off the third transistor. The pixel circuit also includes a fourth transistor, where a source electrode of the fourth transistor is connected with the second node, and a gate electrode of the fourth transistor is configured to receive a fourth scanning signal for turning on and off the fourth transistor. The pixel circuit also includes a light emitting diode, where an anode of the light emitting diode is connected with the second node and a cathode of the light emitting diode is configured to receive a second power supply signal. The pixel circuit also includes a compensating diode, where an anode of the compensating diode is connected with a drain electrode of the fourth transistor, and a cathode of the compensating diode is configured to receive the second power supply signal. The method includes: during an initialization stage, applying the first power supply signal to the first node. The method also includes, during a threshold voltage acquiring stage bringing a potential at the first node brought to the sum of a threshold voltage of the light emitting diode and a threshold voltage of the driving transistor, and bringing a potential at the second node to the threshold voltage of the light emitting diode. The method also includes, during data writing and compensating stage, bringing a potential at the third node is to a potential of the data signal, and bringing the potential at the second node to the threshold voltage of the compensating diode, where the potential at the first node is determined by the data signal and a voltage difference between the threshold voltage of the compensating diode and the threshold voltage of the light emitting diode. The method also includes, during a light emitting stage, driving the light emitting diode with the driving transistor.

Another inventive aspect is an organic light emitting display device, including a pixel circuit of an organic light emitting display device. The pixel circuit includes a driving transistor, where a gate electrode of the driving transistor is connected with a first node. The pixel circuit also includes a first transistor, where a drain electrode of the first transistor is connected with a source electrode of the driving transistor, a source electrode of the first transistor is configured to receive a first power supply signal, and a gate electrode of the first transistor is configured to receive a first scanning signal for turning on and off the first transistor. The pixel circuit also includes a second transistor, where a drain electrode of the second transistor is connected with the source electrode of the driving transistor, a source electrode of the second transistor is connected with the first node, and a gate electrode of the second transistor is configured to receive a second scanning signal for turning on and off the second transistor. The pixel circuit also includes a first capacitor, where a first terminal of the first capacitor is connected with the first node, and a second terminal of the first capacitor is connected with a second node. The pixel circuit also includes a second capacitor, where a first terminal of the second capacitor is connected with the first node, and a second terminal of the second capacitor is connected with a third node. The pixel circuit also includes a third transistor, where a drain electrode of the third transistor is connected with the third node, a source electrode of the third transistor is configured to receive a data signal, and a gate electrode of the third transistor is configured to receive a third scanning signal for turning on and off the third transistor. The pixel circuit also includes a fourth transistor, where a source electrode of the fourth transistor is connected with the second node, and a gate electrode of the fourth transistor is configured to receive a fourth scanning signal for turning on and off the fourth transistor. The pixel circuit also includes a light emitting diode, where an anode of the light emitting diode is connected with the second node and a cathode of the light emitting diode is configured to receive a second power supply signal. The pixel circuit also includes a compensating diode, where an anode of the compensating diode is connected with a drain electrode of the fourth transistor, and a cathode of the compensating diode is configured to receive the second power supply signal.

BRIEF DESCRIPTION OF THE DRAWINGS

The accompanying drawings herein are used for further understanding the present invention and constitute a part of the present invention, but are not intended to limit the present invention.

DETAILED DESCRIPTION OF THE PREFERRED EMBODIMENTS

The present invention will be further described in detail below in conjunction with the accompanying drawings and embodiments. It should be noted that the specific embodiments disclosed herein is merely intended for explaining, rather than limiting, the present invention. It should also be noted that the accompanying drawings show only parts relating to the present invention, but not in an exhausting way, for the ease of description.

An organic light emitting display device generally includes a display panel constituted by a plurality of pixel circuits. To display an image or video, different grey scales are displayed in the display panel by driving light emitting diodes (i.e. organic light emitting diodes) in the pixel circuits to emit light, thus the image is displayed. Therefore, it is vital for the light emitting diode to maintain enough brightness for displaying each time in order to guarantee the display quality of the organic light emitting display device. However, the degradation phenomena of the light emitting diode in the pixel circuit occurs after the light emitting diode has illuminated over a long time, thereby causing an increase in a threshold voltage of the light emitting diode and further reducing the current flowing through the light emitting diode. After the current flowing through the light emitting diode is reduced, the illumination brightness of the light emitting diode is reduced such that the display quality of the organic light emitting display device is lowered correspondingly. In view of this defect, the present invention provides an improvement to the pixel circuit of the organic light emitting display device.

Figure 1A:
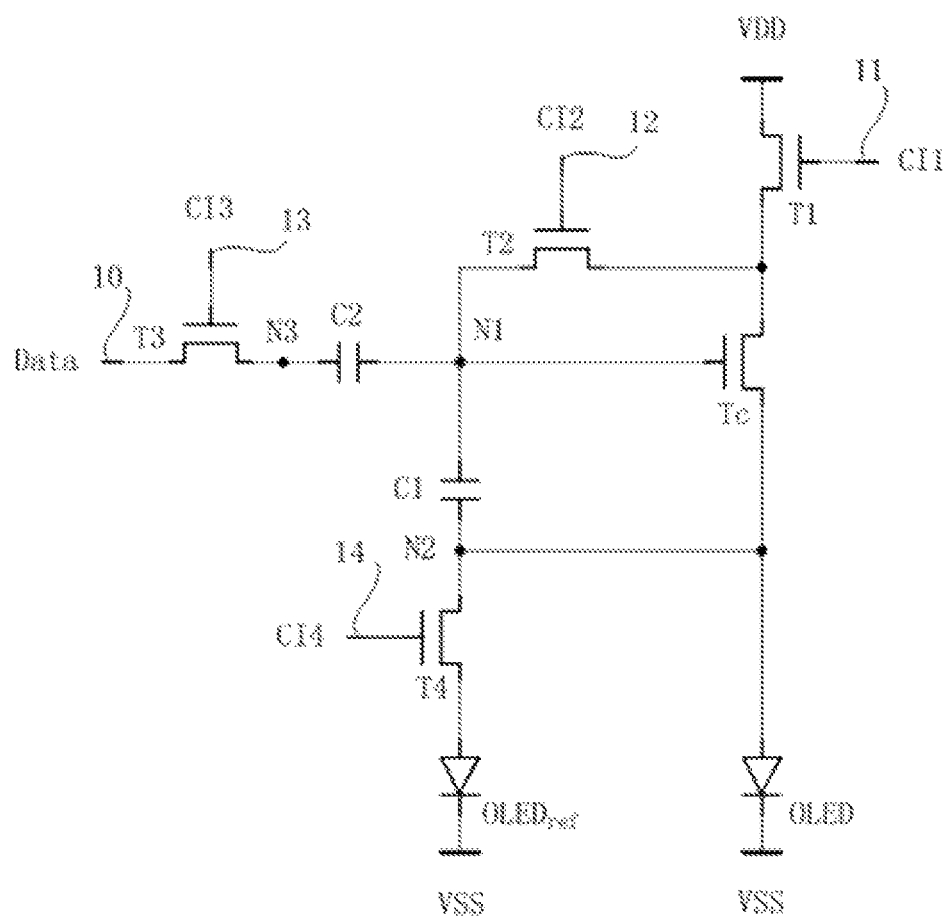
FIG. 1A is a schematic view showing a structure of a pixel circuit according to a first embodiment of the present invention.

FIG. 1A is a schematic view showing a structure of a pixel circuit according to a first embodiment of the present invention. Referring to FIG. 1A, the pixel circuit in an organic light emitting display device in the present embodiment includes: a driving transistor Tc, a first transistor T1, a second transistor T2, a third transistor T3, a fourth transistor T4, a first capacitor C1, a second capacitor C2, a light emitting diode OLED and a compensating diode $OLED_{ref}$. Meanwhile, a first scanning signal line 11 providing a first scanning signal CI1, a second scanning signal line 12 providing a second scanning signal CI2, a third scanning signal line 13 providing a third scanning signal CI3, a fourth scanning signal line 14 providing a fourth scanning signal CI4 and a data line 10 providing a data signal Data are also shown in FIG. 1A.

Referring to FIG. 1A, a gate electrode of the driving transistor Tc is connected with a first node N1.

A drain electrode of the first transistor T1 is connected with a source electrode of the driving transistor Tc and a source electrode of the first transistor T1 is configured to receive a first power supply signal VDD; a gate electrode of the first transistor T1 is configured to receive the first scanning signal CI1 for turning on and off the first transistor T1. More particularly, the gate electrode of the first transistor T1 is connected with the first scanning signal line 11 to receive the first scanning signal CI1.

A drain electrode of the second transistor T2 is connected with the source electrode of the driving transistor Tc, a source electrode of the second transistor T2 is connected with the first node N1, and a gate electrode of the second transistor T2 is configured to receive the second scanning signal CI2 for turning on and off the second transistor T2. More particularly, the gate electrode of the second transistor T2 is connected with the second scanning signal line 12 to receive the second scanning signal CI2.

A first terminal (i.e. plate) of the first capacitor C1 is connected with the first node N1, and a second terminal of the capacitor C1 is connected with a second node N2.

A first terminal of the second capacitor C2 is connected with the first node N1, and a second terminal of the capacitor C2 is connected with a third node N3.

A drain electrode of the third transistor T3 is connected with the third node N3, a source electrode of the third transistor T3 is configured to receive the data signal Data; and a gate electrode of the third transistor T3 is configured to receive the third scanning signal CI3 for turning on and off the third transistor T3. More particularly, the source electrode of the third transistor T3 is connected with the data line 10 to receive the data signal Data; and the gate electrode of the third transistor T3 is connected with the third scanning signal line 13 to receive the third scanning signal CI3.

A source electrode of the fourth transistor T4 is connected with the second node N2, a gate electrode of the fourth transistor T4 is configured to receive the fourth scanning signal CI4 for turning on and off the fourth transistor T4, and more particularly, the gate electrode of the fourth transistor T4 is connected with the fourth scanning signal line 14 to receive the fourth scanning signal CI4.

An anode of the light emitting diode OLED is connected with the second node N2, and a cathode of the light emitting diode OLED is configured to receive a second power supply signal VSS.

An anode of the compensating diode $OLED_{ref}$ is connected with a drain electrode of the fourth transistor T4 and a cathode of the compensating diode $OLED_{ref}$ is configured to receive the second power supply signal VSS. In the present embodiment, the encapsulation standard for the compensating diode $OLED_{ref}$ is the same as that for the light emitting diode OLED, and a threshold voltage of the compensating diode $OLED_{ref}$ is the same as that of the light emitting diode OLED in encapsulating. The threshold voltage of the compensating diode $OLED_{ref}$ is not varied with the continuity of using the organic light emitting display device. Therefore, a precise reference can be provided in the use of the organic light emitting display device to compensate the degradation of the light emitting diode OLED, thereby ensuring the maintained stable and normal illumination brightness of the organic light emitting diode OLED in displaying each time.

Figure 1B:
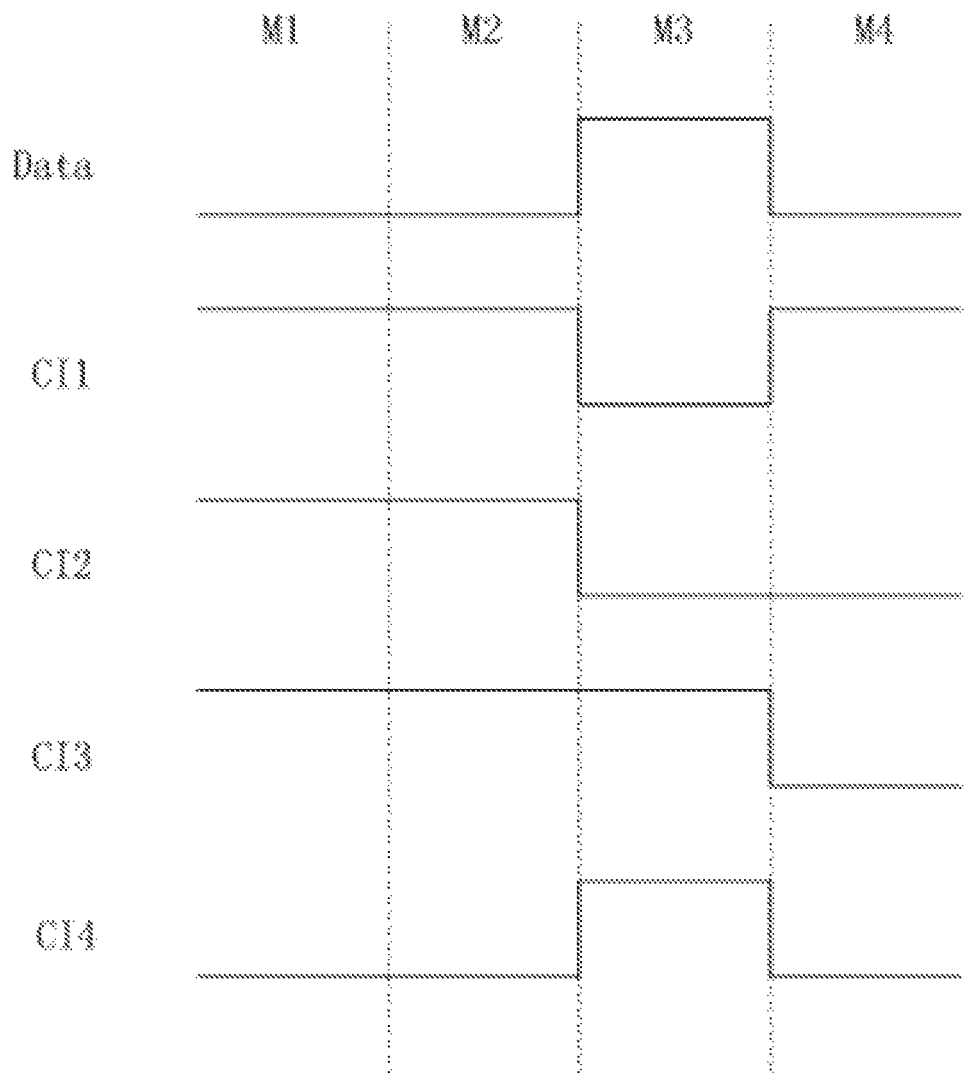
FIG. 1B is a schematic view showing time sequences of driving signals of the pixel circuit according to the first embodiment of the present invention.

FIG. 1B is a schematic view showing time sequences of the driving signals according to the first embodiment of the present invention. Referring to FIG. 1B, in the case that the pixel circuit of the organic light emitting display device is driven by the driving signals, a specific workflow of the pixel circuit of the organic light emitting display device is as follows.

At an initialization stage referred to as a stage M1, the first scanning signal CI1 and the second scanning signal CI2 are used to turn on the first transistor T1 and the second transistor T2, respectively, and a potential at the first node N1 is initialized as a potential of the first power supply signal VDD.

Figure 1C:
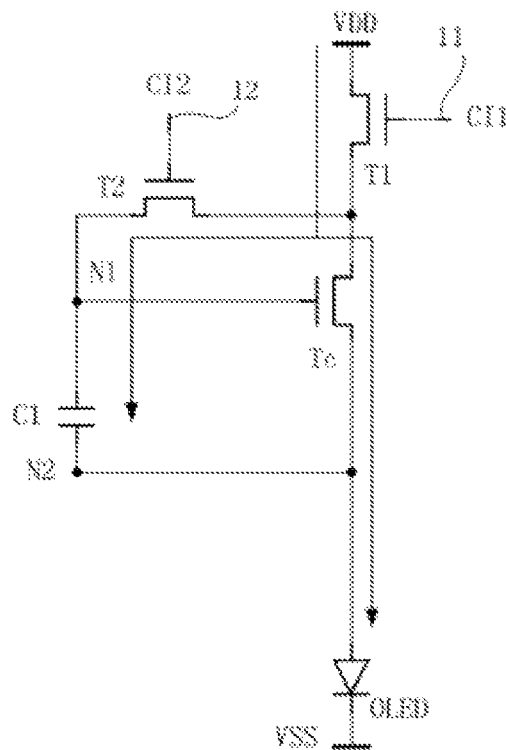
FIG. 1C is a schematic view showing an equivalent circuit of the pixel circuit during a stage M1 in FIG. 1B.

Specifically, referring to FIGS. 1A, 1B and 1C, each of the first scanning signal CI1, the second scanning signal CI2 and the third scanning signal CI3 is at a high level, and the fourth scanning signal CI4 is at a low level. The first scanning signal CI1 turns on the respective first transistor T1, the second scanning signal CI2 turns on the second transistor T2, the third scanning signal CI3 turns on the third transistor T3, and the fourth scanning signal CI4 turns off the fourth transistor T4. Referring to FIG. 1C, the first power supply signal VDD is transferred to the first node N1 through the turned on first transistor T1 and the turned on second transistor T2 such that the potential $V_{N1}$ at the first node N1 is initialized as the potential of the first power supply signal VDD, that is, $V_{N1}=V_{DD}$, and is stored in the first capacitor C1, where $V_{DD}$ represents the potential of the first power supply signal VDD, and the potential $V_{N1}$ at the first node N1 turns on the driving transistor Tc.

At a threshold voltage acquiring stage referred to as a stage M2, the first scanning signal CI1 turns off the first transistor T1, the first capacitor C1 is discharged through the second transistor T2 and the driving transistor Tc until the potential $V_{N1}$ at the first node N1 is equal to the sum of the threshold voltage of the light emitting diode OLED and the threshold voltage of the driving transistor Tc, and the potential $V_{N2}$ at the second node N2 is equal to the threshold voltage of the light emitting diode OLED.

Figure 1D:
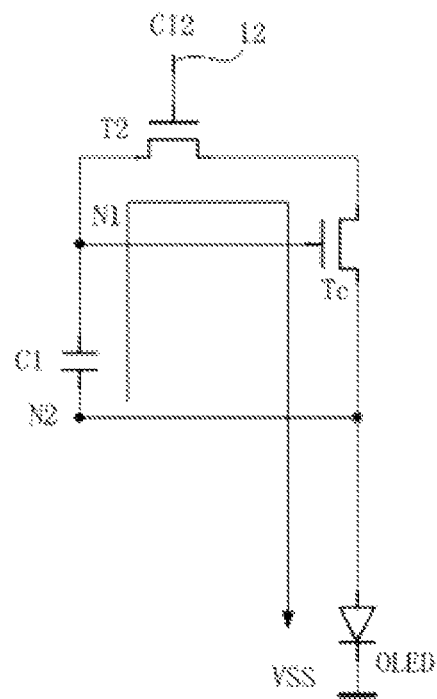
FIG. 1D is a schematic view showing an equivalent circuit of the pixel circuit during a stage M2 in FIG. 1B.

Specifically, referring to FIGS. 1A, 1B and 1D, each of the first scanning signal CI1, the second scanning signal CI2 and the third scanning signal CI3 remains at a high level, and the fourth scanning signal CI4 remains at a low level. The first scanning signal CI1 turns off the first transistor T1 such that the first power supply signal VDD is no longer applied to the pixel circuit. Meanwhile, a path is formed by the first capacitor C1, the second transistor T2 and the driving transistor Tc, as can be seen from FIG. 1D, and charges stored in the first capacitor C1 are charged via the first node N1 through the second transistor T2 and the turned on driving transistor Tc such that the potential $V_{N1}$ at the first node is as follows:

$$V_{N1}=V_{th\text{-}OLED}+V_{th},$$

and the potential $V_{N2}$ at the second node is as follows:

$$V_{N2}=V_{th\text{-}OLED};$$

where $V_{th}$ represents the threshold voltage of the driving transistor Tc and $V_{th\text{-}OLED}$ represents the threshold voltage of the light emitting diode OLED.

At a data writing and compensating stage referred to as a stage M3, the fourth scanning signal CI4 turns on the fourth transistor T4, the potential $V_{N3}$ at the third node N3 is equal to the potential of the data signal Data, the potential $V_{N2}$ at the second node N2 is equal to the threshold voltage of the compensating diode $OLED_{ref}$ and the potential $V_{N1}$ at the first node N1 is determined by the data signal Data and a voltage difference between the threshold voltage of the compensating diode $OLED_{ref}$ and the threshold voltage of the light emitting diode OLED.

Figure 1E:
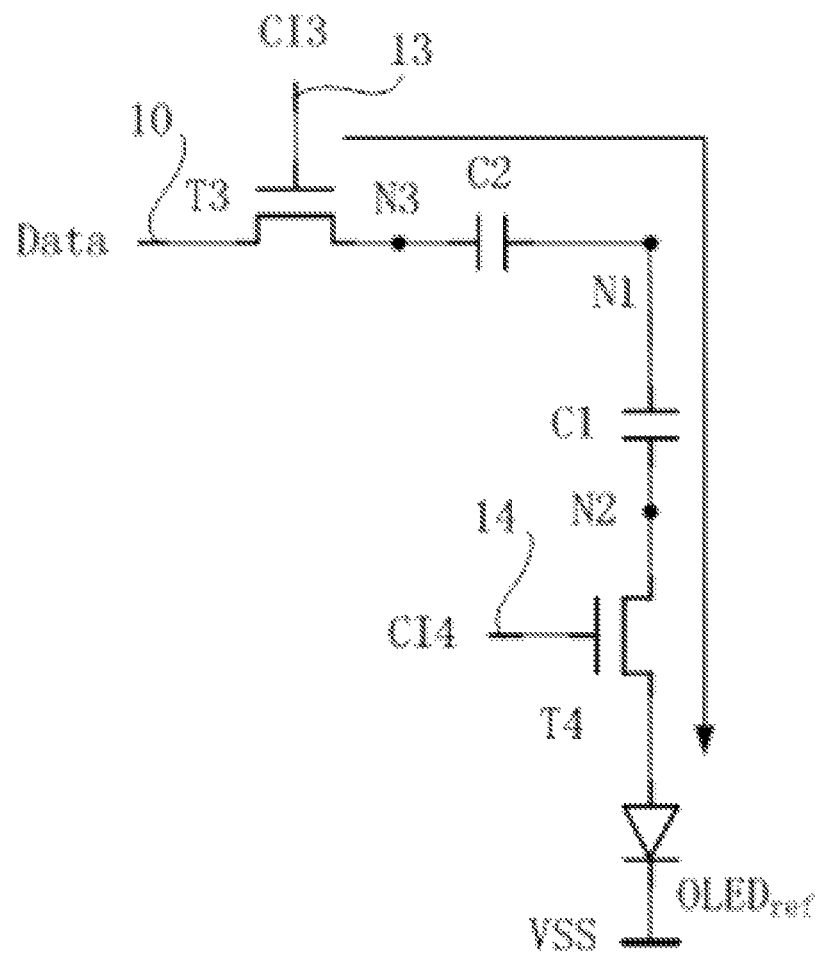
FIG. 1E is a schematic view showing an equivalent circuit of the pixel circuit during a stage M3 in FIG. 1B.

Specifically, referring to FIGS. 1A, 1B and 1E, the data line 10 starts to provide the data signal Data, the first scanning signal CI1 and the second scanning signal CI2 change to a low level, the third scanning signal CI3 maintains at a high level and the fourth scanning signal CI4 changes to a high level. Referring to FIG. 1E, the second scanning signal CI2 turns off the second transistor T2, and the fourth scanning signal CI4 turns on the fourth transistor T4, hence a path is formed by the third transistor T3, the second capacitor C2, the first capacitor C1, the fourth transistor T4 and the compensating diode $OLED_{ref}$. Under the effect of the data signal Data, the potential $V_{N3}$ at the third node N3 is equal to $V_{Data}$ (i.e. $V_{N3}=V_{Data}$), and the potential $V_{N2}$ at the second node N2 after the discharge through the path is equal to $V_{th\text{-}OLED\text{-}ref}$, i.e. $V_{N2}=V_{th\text{-}OLED\text{-}ref}$, where $V_{Data}$ represents a potential of the data signal Data and $V_{th\text{-}OLED\text{-}ref}$ represents the threshold voltage of the compensating diode $OLED_{ref}$.

Since the sum of the charges of the first capacitor C1 and the charges of the second capacitor C2 maintains constant during the transferring of the charges in this stage, then according to the law of conservation of charge, $$[(V_{data} - V_0) - (V_{N1} - V_{N1\text{H}})]C_2 =$$
$$[(V_{N1} - V_{N1\text{H}}) - (V_{th-OLED-ref} - V_{th-OLED})]C_1,$$

thus $$V_{N1} - V_{N1previous} = \frac{(V_{Data} - V_0)C_2 + (V_{th-OLED-ref} - V_{th-OLED})C_1}{C_1 + C_2},$$

that is, $$V_{N1} = \frac{(V_{Data} - V_0)C_2 + (V_{th-OLED-ref} - V_{th-OLED})C_1}{C_1 + C_2} + V_{N1\ previous}$$
$$= \frac{(V_{Data} - V_0)C_2 + (V_{th-OLED-ref} - V_{th-OLED})C_1}{C_1 + C_2} + V_{th-OLED} + V_{th}$$
$$= \frac{(V_{Data} - V_0)C_2 + V_{th-OLED-ref}C_1 + V_{th-OLED}C_2}{C_1 + C_2} + V_{th}$$

Considering $V_{N2}=V_{th\text{-}OLED\text{-}ref}$ and $V_{N1\ previous}=V_{th\text{-}OLED}+V_{th}$, then $$V_{N1-N2} = \frac{(V_{Data} - V_0 + V_{th-OLED} - V_{th-OLED-ref})C_2}{C_1 + C_2} + V_{th}.$$

$V_{N1\ previous}$ represents the potential $V_{N1}$ at the first node N1 before the discharge (i.e. in the stage M2), and $V_{N1\ previous}=V_{th\text{-}OLED}+V_{th}$. $V_0$ represents the potential at the third node N3 when the data signal Data is not present.

After the stage M3, the data signal is written to the gate electrode of the driving transistor Tc, and further the voltage difference between the threshold voltage of the light emitting diode OLED and the threshold voltage of the compensating diode $OLED_{ref}$ is written to the gate electrode of the driving transistor Tc, to compensate the degradation of the light emitting diode OLED in the pixel circuit, thereby ensuring the normal illumination brightness of the light emitting diode OLED.

At a light emitting stage referred to as a stage M4, the first scanning signal CI1 turns on the first transistor T1, the second scanning signal CI2 turns off the second transistor T2, the third scanning signal CI3 turns off the third transistor T3, and the fourth scanning signal CI4 turns off the fourth transistor T4. The light emitting diode OLED is driven by the driving transistor Tc to emit light.

Figure 1F:
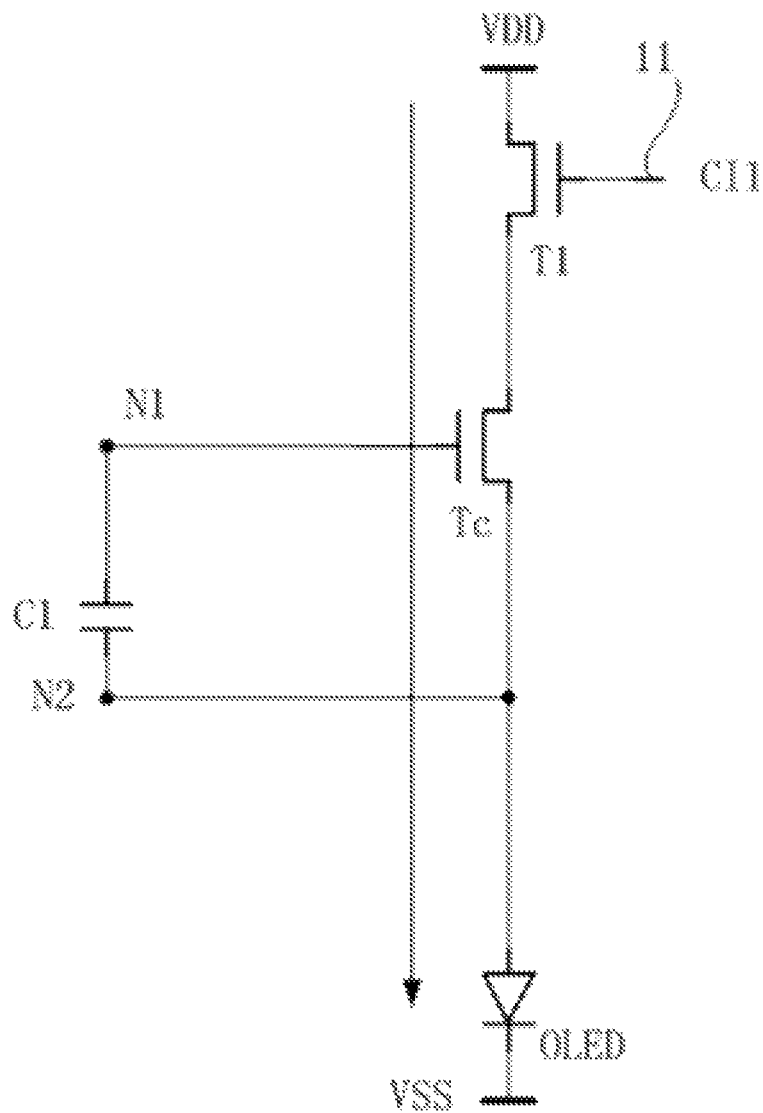
FIG. 1F is a schematic view showing an equivalent circuit of the pixel circuit during a stage M4 in FIG. 1B.

Specifically, referring to FIGS. 1A,1B and 1F, the first scanning signal CI1 changes to a high level, the second scanning signal CI2 maintains at a low level, and the third scanning signal CI3 and the fourth scanning signal CI4 change to a low level. Referring to FIG. 1F, the first scanning signal CI1 turns on the first transistor T1, the third scanning signal CI3 turns off the third transistor T3 and the fourth scanning signal CI4 turns off the fourth transistor T4, thus a path is formed by the first transistor T1, the driving transistor Tc and the light emitting diode OLED. Under the effect of the first power supply signal VDD and a voltage difference between the gate electrode of the driving transistor Tc and the source electrode of the driving transistor Tc, current $I_{OLED}$ flowing through the light emitting diode OLED is depicted as:

$$I_{OLED} = \frac{1}{2}k(V_{gs} - V_{th})^2 = \frac{1}{2}k\left[\frac{(V_{Data} - V_0 + V_{th-OLED} - V_{th-OLED-ref})C_2}{C_1 + C_2}\right]^2,$$

where $V_{gs}$ represents the voltage difference between the gate electrode of the driving transistor Tc and the source electrode of the driving transistor Tc.

As such, the gate electrode of the driving transistor Tc is compensated by the voltage difference between the threshold voltage of the compensating diode $OLED_{ref}$ and the threshold voltage of the light emitting diode OLED, and the light emitting diode OLED is controlled to emit light for displaying the image, the degradation of the light emitting diode OLED in use is compensated, and the illumination brightness of the light emitting diode OLED is guaranteed, thereby ensuring the a good display quality of the image and video displayed by the organic light emitting display device.

Alternatively, the data signal is not provided in the initialization stage, threshold voltage acquiring stage, and the light emitting stage in the embodiment. Specifically, the data line 10 may be suspended to stop providing the data signal in the initialization stage, threshold voltage acquiring stage, and the light emitting stage in the embodiment.

Alternatively, the first scanning signal CI1, the second scanning signal CI2, the third scanning signal CI3 and the fourth scanning signal CI4 are independent of each other in time sequences in the embodiment.

Alternatively, the levels of the first power supply signal VDD and the second power supply signal VSS are constant, where the first power supply signal VDD is at a constant high level and the second power supply signal VSS is at a constant low level.

In the present embodiment, it should be noted that each of the first transistor T1, the second transistor T2, the third transistor T3, the fourth transistor T4 and the driving transistor Tc is a NMOS transistor. In other embodiments, each of the first transistor T1, the second transistor T2, the third transistor T3, the fourth transistor T4 and the driving transistor Tc may be a PMOS transistor, in this case, the first scanning signal CI1, the second scanning signal CI2, the third scanning signal CI3 and the fourth scanning signal CI4 are inversed, and the first power supply signal and the second power supply signal are also inversed.

The pixel circuit of the organic light emitting display device in the embodiment includes the compensating diode, the threshold voltage of which is the same as that of the light emitting diode OLED in encapsulating, and the degradation of the compensating diode will not occur in use. Thus, when each of the pixel circuits in the organic light emitting display device according to the present embodiment is normally driven to display an image, the voltage difference between the threshold voltage of the compensating diode and the threshold voltage of the organic light emitting diode is obtained, and the gate electrode of the driving transistor is compensated by the obtained voltage difference, so that the voltage difference between the gate electrode of the driving transistor and the source electrode of the driving transistor is $$\frac{(V_{Data} - V_0 + V_{th-OLED} - V_{th-OLED-ref})C_2}{C_1 + C_2} + V_{th},$$

and hence the degradation of the light emitting diode caused by longtime illumination is compensated by using the voltage difference (i.e. $V_{th\text{-}OLED} - V_{th\text{-}OLED\text{-}ref}$) between the light emitting diode and the compensating diode. Thanks to this compensation by the compensating diode, the stability of the current flowing through the light emitting diode is guaranteed, thereby the stability of the illumination brightness of the light emitting diode can be guaranteed after the light emitting diode has illuminated over a long time. Therefore, the display quality of the image displayed by the organic light emitting display device is guaranteed due to the brightness stability of the light emitting diode.

Meanwhile, under the effect of the compensating diode, the light emitting diode can still maintain normal illumination brightness even after illuminating over a long time, thereby prolonging the service life of the organic light emitting display device.

Figure 2:
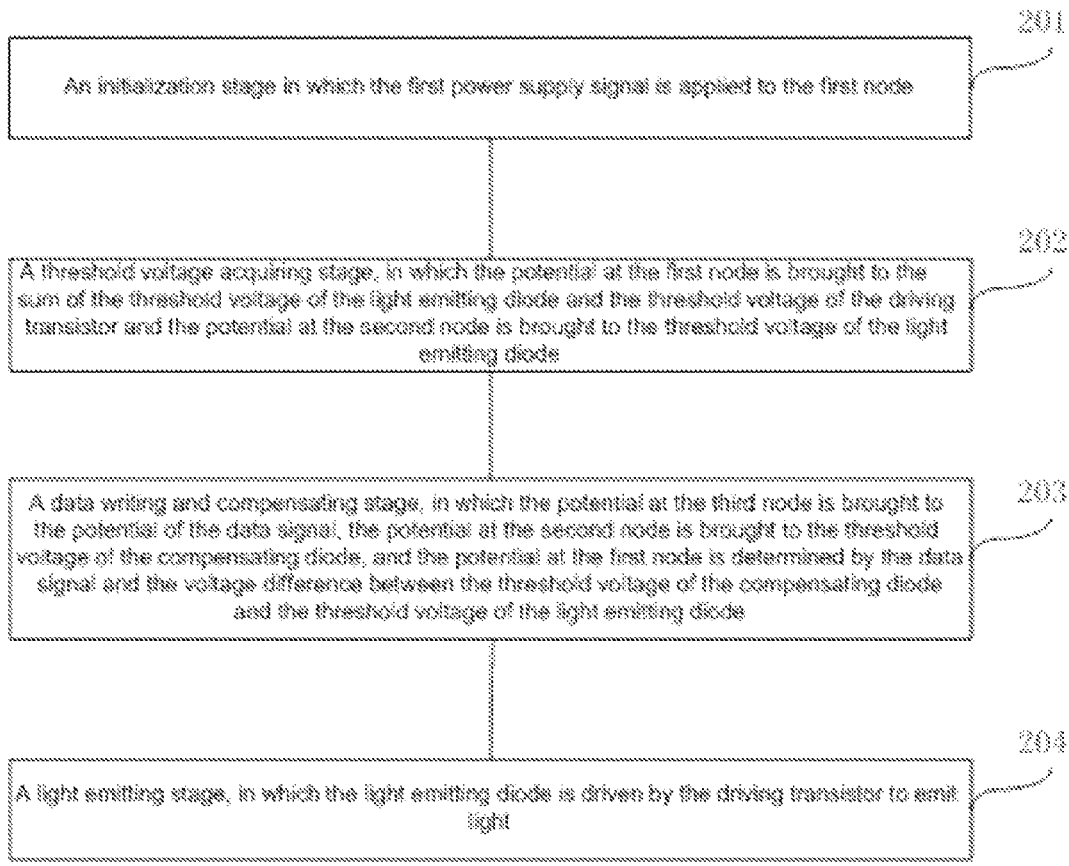
FIG. 2 is a flow chart showing a method of driving a pixel circuit of the organic light emitting display device according to a second embodiment of the present invention.

FIG. 2 is a flow chart showing a method of driving a pixel circuit of the organic light emitting display device according to a second embodiment of the present invention. The specific implementations of the second embodiment is based on the pixel circuit of the organic light emitting display device in the first embodiment, reference may be made to the description of the first embodiment for relevant concepts and explanation, which will not be described again in detail in this embodiment. Referring to FIGS. 1A and 2, the method of driving the pixel circuit includes the following Steps 201 to 204.

Step 201 is an initialization stage in which the first power supply signal VDD is applied to the first node N1.

Specifically, the first scanning signal CI1 and the second scanning signal CI2 turn on the first transistor T1 and the second transistor T2, respectively, and the potential at the first node N1 is initialized as the potential of the first power supply signal VDD.

Step 202 is a threshold voltage acquiring stage, in which the potential at the first node N1 is brought to the sum of the threshold voltage of the light emitting diode and the threshold voltage of the driving transistor Tc and the potential at the second node N2 is brought to the threshold voltage of the light emitting diode.

Specifically, the first scanning signal CI1 turns off the first transistor T1, and the first capacitor C1 is discharged through the second transistor T2 and the driving transistor Tc, until the potential at the first node N1 is brought to the sum of the threshold voltage of the light emitting diode OLED and the threshold voltage of the driving transistor Tc and the potential at the second node N2 is equal to the threshold voltage of the light emitting diode OLED.

Step 203 is a data writing and compensating stage, in which the potential at the third node N3 is brought to the potential of the data signal, the potential at the second node N2 is brought to the threshold voltage of the compensating diode, and the potential at the first node N1 is determined by the data signal and the voltage difference between the threshold voltage of the compensating diode and the threshold voltage of the light emitting diode.

Specifically, the fourth scanning signal C14 turns on the fourth transistor T4, the potential at the third node N3 is brought to the potential of the data signal Data, the potential at the second node N2 is brought to the threshold voltage of the compensating diode $OLED_{ref}$, and the potential at the first node N1 is determined by the data signal Data and the voltage difference between the threshold voltage of the compensating diode $OLED_{ref}$ and the threshold voltage of the light emitting diode OLED.

Step 204 is a light emitting stage, in which the light emitting diode OLED is driven by the driving transistor Tc to emit light.

Specifically, the first scanning signal CI1 turns on the first transistor T1, the second scanning signal C12 turns off the second transistor T2, the third scanning signal CI3 turns off the third transistor T3, the fourth scanning signal C14 turns off the fourth transistor T4, and the driving transistor Tc drives the light emitting diode OLED to emit light.

The method of driving the pixel circuit of the organic light emitting display device in the embodiment is suitable to drive the pixel circuit including the compensating diode. The threshold voltage of the compensating diode is the same as that of the light emitting diode in encapsulating, and the degradation of the compensating diode will not occur in use. Therefore, according to the method of driving the pixel circuit in the embodiment, when each of the pixel circuits in the organic light emitting display device is driven to display an image, the voltage difference between the threshold voltage of the compensating diode and the threshold voltage of the organic light emitting diode is obtained, and the gate electrode of the driving transistor is compensated by the obtained voltage difference to compensate the degradation (i.e. an increase of threshold voltage) of the light emitting diode after the light emitting diode has illuminated over a long time. Such compensation by the compensating diode guarantees the stability of the current flowing through the light emitting diode, thereby the stability of the illumination brightness of the light emitting diode can be guaranteed after the light emitting diode has illuminated over a long time. Therefore, the display quality of an image displayed by the organic light emitting display device is guaranteed due to the brightness stability of the light emitting diode.

Figure 3:
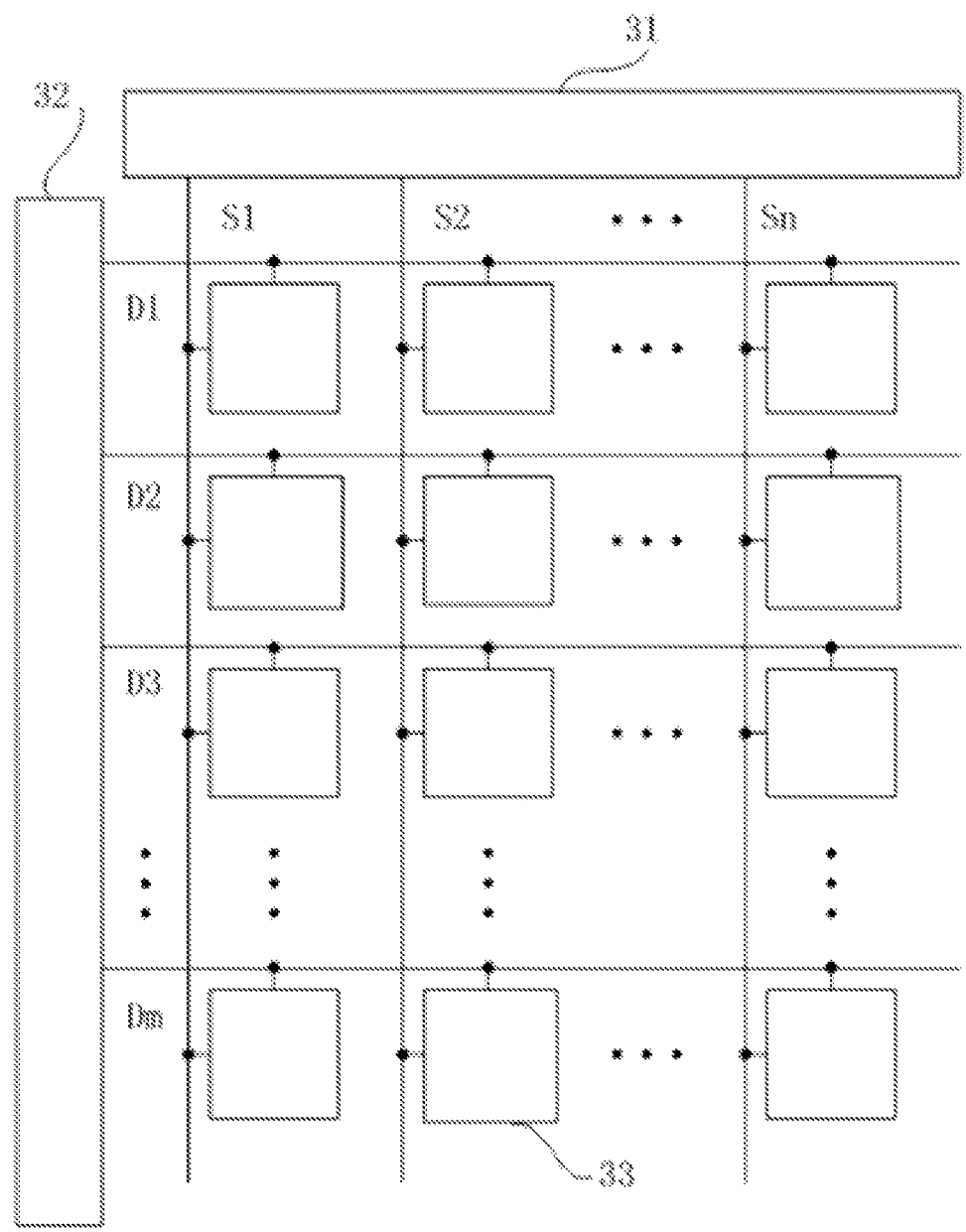
FIG. 3 is a schematic view showing a structure of an organic light emitting display device according to a third embodiment of the present invention.

FIG. 3 is a schematic view showing a structure of an organic light emitting display device according to a third embodiment of the present invention. This embodiment is based on the pixel circuit of the organic light emitting display device provided in the first embodiment. Reference may be made to the description of the first embodiment for relevant concepts and explanation, which will not be described again in detail herein. Referring to FIG. 3, the organic light emitting display device in this embodiment includes: a scan driving unit 31, a data driving unit 32, n scanning lines (S1, S2, . . . , Sn), m data lines (D1, D2, . . . , Dm) and a plurality of pixel circuits 33, where the structure of the pixel circuit in this embodiment is the same as that of the pixel circuit in the first embodiment, and would not be described in detail herein.

Specifically, the scan driving unit 31 is configured to provide a scanning signal to each of the scanning lines (S1, S2, . . . , Sn); the data driving unit 32 is configured to provide a data signal to each of the data lines (D1, D2, . . . , Dm); and each of the plurality of pixel circuits 33 is arranged at a pixel region formed by intersecting the scanning lines with the data lines.

In the organic light emitting display device of this embodiment, each of the pixel circuits includes the compensating diode. The threshold voltage of the compensating diode is the same as that of the light emitting diode OLED in encapsulating, and the degradation of the compensating diode will not occur in use. According to the organic light emitting display device in this embodiment, when each of the pixel circuits in the organic light emitting display device is normally driven to display an image, the voltage difference between the threshold voltage of the compensating diode and the threshold voltage of the organic light emitting diode is obtained, and the gate electrode of the driving transistor is compensated by the obtained voltage difference to compensate the degradation (i.e. an increase of threshold voltage) of the light emitting diode after the light emitting diode has illuminated over a long time. Such compensation by the compensating diode guarantees the stability of the current flowing through the light emitting diode, thereby the stability of the illumination brightness of the light emitting diode can be guaranteed after the light emitting diode has illuminated over a long time. Therefore, the display quality of the image displayed by the organic light emitting display device is guaranteed due to the brightness stability of the light emitting diode.

The preferred embodiments of the present invention are described as above, but are not intended to limit the present invention. Any modifications, equivalent substitutions, improvements, etc., that are made without departing from the spirit and principle of the present invention should fall into the scope of protection of the present invention.

What is claimed is:

1. A pixel circuit of an organic light emitting display device, wherein the pixel circuit comprises:
   a driving transistor, wherein a gate electrode of the driving transistor is connected with a first node;
   a first transistor, wherein a drain electrode of the first transistor is connected with a source electrode of the driving transistor, a source electrode of the first transistor is configured to receive a first power supply signal, and a gate electrode of the first transistor is configured to receive a first scanning signal for turning on and off the first transistor;
   a second transistor, wherein a drain electrode of the second transistor is connected with the source electrode of the driving transistor, a source electrode of the second transistor is connected with the first node, and a gate electrode of the second transistor is configured to receive a second scanning signal for turning on and off the second transistor;
   a first capacitor, wherein a first terminal of the first capacitor is connected with the first node, and a second terminal of the first capacitor is connected with a second node;
   a second capacitor, wherein a first terminal of the second capacitor is connected with the first node, and a second terminal of the second capacitor is connected with a third node;
   a third transistor, wherein a drain electrode of the third transistor is connected with the third node, a source electrode of the third transistor is configured to receive a data signal, and a gate electrode of the third transistor is configured to receive a third scanning signal for turning on and off the third transistor;
   a fourth transistor, wherein a source electrode of the fourth transistor is connected with the second node, and a gate electrode of the fourth transistor is configured to receive a fourth scanning signal for turning on and off the fourth transistor;
   a light emitting diode, wherein an anode of the light emitting diode is connected with the second node and a cathode of the light emitting diode is configured to receive a second power supply signal; and
   a compensating diode, wherein an anode of the compensating diode is connected with a drain electrode of the fourth transistor, and a cathode of the compensating diode is configured to receive the second power supply signal;
   wherein a plurality of working stages of the pixel circuit comprises:
   an initialization stage, during which:
      the first scanning signal turns on the first transistor,
      the second scanning signal turns on the second transistor, and
      a potential at the first node is initialized as a potential of the first power supply signal;
   a threshold voltage acquiring stage, during which:
      the first scanning signal turns off the first transistor, and
      the first capacitor is discharged through the second transistor and the driving transistor until the potential at the first node is brought substantially to the sum of a threshold voltage of the light emitting diode and a threshold voltage of the driving transistor, and
      a potential at the second node is equal to the threshold voltage of the light emitting diode;
   a data writing and compensating stage, during which the fourth scanning signal turns on the fourth transistor,
      a potential at the third node is equal to a potential of the data signal,
      the potential at the second node is equal to a threshold voltage of the compensating diode,
      the potential at the first node is determined by the data signal and a voltage difference between the threshold voltage of the compensating diode and the threshold voltage of the light emitting diode;
   and
   a light emitting stage, during which:
   the first scanning signal turns on the first transistor,
   the second scanning signal turns off the second transistor,
   the third scanning signal turns off the third transistor, the fourth scanning signal turns off the fourth transistor, and
   the driving transistor is configured to drive the light emitting diode to emit light.

2. The pixel circuit of the organic light emitting display device of claim 1, wherein the first scanning signal, the second scanning signal, the third scanning signal, and the fourth scanning signal are independent of each other in time sequences.

3. The pixel circuit of the organic light emitting display device of claim 1, wherein the first scanning signal, the second scanning signal, the third scanning signal, and the fourth scanning signal are independent of each other in time sequences.

4. The pixel circuit of the organic light emitting display device of claim 1, wherein the data signal is not provided during the initialization state, during the threshold voltage acquiring stage, nor during the data writing and compensating stage.

5. The pixel circuit of an organic light emitting display device of claim 1, wherein levels of the first power supply signal and the second power supply signal are constant.

6. The pixel circuit of the organic light emitting display device of claim 1, wherein the first transistor, the second transistor, the third transistor, the fourth transistor, and the driving transistor are all NMOS transistors or are all PMOS transistors.

7. A method of driving a pixel circuit of an organic light emitting display device, the pixel circuit comprising:
a driving transistor, wherein a gate electrode of the driving transistor is connected with a first node;
a first transistor, wherein:
a drain electrode of the first transistor is connected with a source electrode of the driving transistor,
a source electrode of the first transistor is configured to receive a first power supply signal, and
a gate electrode of the first transistor is configured to receive a first scanning signal for turning on and off the first transistor;
a second transistor, wherein:
a drain electrode of the second transistor is connected with the source electrode of the driving transistor,
a source electrode of the second transistor is connected with the first node, and
a gate electrode of the second transistor is configured to receive a second scanning signal for turning on and off the second transistor;
a first capacitor, wherein:
a first terminal of the first capacitor is connected with the first node, and
a second terminal of the first capacitor is connected with a second node;
a second capacitor, wherein:
a first terminal of the second capacitor is connected with the first node, and
a second terminal of the second capacitor is connected with a third node;
a third transistor, wherein:
a drain electrode of the third transistor is connected with the third node,
a source electrode of the third transistor is configured to receive a data signal, and
a gate electrode of the third transistor is configured to receive a third scanning signal for turning on and off the third transistor;
a fourth transistor, wherein:
a source electrode of the fourth transistor is connected with the second node, and
a gate electrode of the fourth transistor is configured to receive a fourth scanning signal for turning on and off the fourth transistor;
a light emitting diode, wherein:
an anode of the light emitting diode is connected with the second node, and
a cathode of the light emitting diode is configured to receive a second power supply signal; and
a compensating diode, wherein:
an anode of the compensating diode is connected with a drain electrode of the fourth transistor, and
a cathode of the compensating diode is configured to receive the second power supply signal,
wherein the method comprises:
during an initialization stage, applying the first power supply signal to the first node such that the first scanning signal turns on the first transistor, the second scanning signal turns on the second transistor, and a potential at the first node is initialized as a potential of the first power supply signal;
during a threshold voltage acquiring stage:
bringing the potential at the first node brought to the sum of a threshold voltage of the light emitting diode and a threshold voltage of the driving transistor, and
bringing a potential at the second node to the threshold voltage of the light emitting diode, such that the first scanning signal turns off the first transistor, and the first capacitor is discharged through the second transistor and the driving transistor until the potential at the first node is brought substantially to the sum of the threshold voltage of the light emitting diode and the threshold voltage of the driving transistor, and the potential at the second node is equal to the threshold voltage of the light emitting diode;
during data writing and compensating stage,
bringing a potential at the third node is to a potential of the data signal, and
bringing the potential at the second node to the threshold voltage of the compensating diode, such that the potential at the third node is equal to a potential of the data signal, the potential at the second node is equal to a threshold voltage of the compensating diode, the potential at the first node is determined by the data signal and a voltage difference between the threshold voltage of the compensating diode and the threshold voltage of the light emitting diode,
wherein the potential at the first node is determined by the data signal and a voltage difference between the threshold voltage of the compensating diode and the threshold voltage of the light emitting diode; and
during a light emitting stage, driving the light emitting diode with the driving transistor, such that the first scanning signal turns on the first transistor, the second scanning signal turns off the second transistor, the third scanning signal turns off the third transistor, the fourth scanning signal turns off the fourth transistor, and the driving transistor is configured to drive the light emitting diode to emit light.

8. The method of claim 7, wherein, during the initialization stage:
the first scanning signal turns on the first transistor,
the second scanning signal turns on the second transistor, and
the potential at the first node is initialized as the potential of the first power supply signal.

9. The method of claim 7, wherein during the threshold voltage acquiring stage:
the first scanning signal turns off the first transistor,
the first capacitor is discharged through the second transistor and the driving transistor until the potential at the first node is brought to the sum of the threshold voltage of the light emitting diode and the threshold voltage of the driving transistor, and
the potential at the second node is equal to the threshold voltage of the light emitting diode.

10. The method of claim 7, wherein during the data writing and compensation stage:
the fourth scanning signal turns on the fourth transistor,
the potential at the third node is equal to the potential of the data signal,
the potential at the second node is equal to the threshold voltage of the compensating diode, and
the potential at the first node is determined by the data signal and a voltage difference between the threshold voltage of the compensating diode and the threshold voltage of the light emitting diode.

11. The method of claim 7, wherein during the light emitting stage:

the first scanning signal turns on the first transistor,
the second scanning signal turns off the second transistor,
the third scanning signal turns off the third transistor,
the fourth scanning signal turns off the fourth transistor, and
the driving transistor drives the light emitting diode to emit light.

12. An organic light emitting display device, comprising a pixel circuit of an organic light emitting display device, the pixel circuit comprising:
  a driving transistor, wherein a gate electrode of the driving transistor is connected with a first node;
  a first transistor, wherein:
    a drain electrode of the first transistor is connected with a source electrode of the driving transistor,
    a source electrode of the first transistor is configured to receive a first power supply signal, and
    a gate electrode of the first transistor is configured to receive a first scanning signal for turning on and off the first transistor;
  a second transistor, wherein:
    a drain electrode of the second transistor is connected with the source electrode of the driving transistor,
    a source electrode of the second transistor is connected with the first node, and
    a gate electrode of the second transistor is configured to receive a second scanning signal for turning on and off the second transistor;
  a first capacitor, wherein:
    a first terminal of the first capacitor is connected with the first node, and
    a second terminal of the first capacitor is connected with a second node;
  a second capacitor, wherein:
    a first terminal of the second capacitor is connected with the first node, and
    a second terminal of the second capacitor is connected with a third node;
  a third transistor, wherein:
    a drain electrode of the third transistor is connected with the third node,
    a source electrode of the third transistor is configured to receive a data signal, and
    a gate electrode of the third transistor is configured to receive a third scanning signal for turning on and off the third transistor;
  a fourth transistor, wherein:
    a source electrode of the fourth transistor is connected with the second node, and
    a gate electrode of the fourth transistor is configured to receive a fourth scanning signal for turning on and off the fourth transistor;
  a light emitting diode, wherein:
    an anode of the light emitting diode is connected with the second node, and
    a cathode of the light emitting diode is configured to receive a second power supply signal; and
  a compensating diode, wherein:
    an anode of the compensating diode is connected with a drain electrode of the fourth transistor, and
    a cathode of the compensating diode is configured to receive the second power supply signal;
  wherein a plurality of working stages of the pixel circuit comprises:
  an initialization stage, during which:
    the first scanning signal turns on the first transistor,
    the second scanning signal turns on the second transistor, and
    a potential at the first node is initialized as a potential of the first power supply signal:
  a threshold voltage acquiring stage, during which:
    the first scanning signal turns off the first transistor, and the first capacitor is discharged through the second transistor and the driving transistor until the potential at the first node is brought substantially to the sum of a threshold voltage of the light emitting diode and a threshold voltage of the driving transistor, and
    a potential at the second node is equal to the threshold voltage of the light emitting diode;
  a data writing and compensating stage, during which the fourth scanning signal turns on the fourth transistor,
    a potential at the third node is equal to a potential of the data signal,
    the potential at the second node is equal to a threshold voltage of the compensating diode, the potential at the first node is determined by the data signal and a voltage difference between the threshold voltage of the compensating diode and the threshold voltage of the light emitting diode;
  and
  a light emitting stage, during which:
  the first scanning signal turns on the first transistor,
  the second scanning signal turns off the second transistor,
  the third scanning signal turns off the third transistor, the fourth scanning signal turns off the fourth transistor, and
  the driving transistor is configured to drive the light emitting diode to emit light.

* * * * *